United States Patent
Ito et al.

(10) Patent No.: US 12,221,557 B2
(45) Date of Patent: Feb. 11, 2025

(54) POLISHING COMPOSITION AND POLISHING METHOD

(71) Applicant: FUJIMI INCORPORATED, Kiyosu (JP)

(72) Inventors: Daiki Ito, Kiyosu (JP); Toshio Shinoda, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 341 days.

(21) Appl. No.: 17/679,415

(22) Filed: Feb. 24, 2022

(65) Prior Publication Data

US 2022/0275246 A1    Sep. 1, 2022

(30) Foreign Application Priority Data

Feb. 26, 2021   (JP) .................... 2021-30021

(51) Int. Cl.
  *C09G 1/02* (2006.01)
  *C09G 1/18* (2006.01)
  *H01L 21/306* (2006.01)

(52) U.S. Cl.
  CPC .............. *C09G 1/02* (2013.01); *C09G 1/18* (2013.01); *H01L 21/30625* (2013.01)

(58) Field of Classification Search
  None
  See application file for complete search history.

(56) References Cited

U.S. PATENT DOCUMENTS

| 10,676,647 | B1 * | 6/2020 | Zhang ............... H01L 21/3212 |
| 2010/0075502 | A1 | 3/2010 | Li et al. |
| 2021/0163785 | A1 * | 6/2021 | Kim .................. C08G 73/0233 |

FOREIGN PATENT DOCUMENTS

| JP | 2008-181954 A | 8/2008 |
| JP | 2011-216582 A | 10/2011 |
| JP | 2012-503329 A | 2/2012 |
| JP | 2019-057615 A | 4/2019 |
| JP | 2020-164662 A | 10/2020 |

* cited by examiner

*Primary Examiner* — Roberts P Culbert
(74) *Attorney, Agent, or Firm* — Foley & Lardner LLP

(57) ABSTRACT

There is provided a polishing composition capable of improving the polishing removal rate of silicon nitride to polish silicon oxide and silicon nitride at the same polishing removal rate and polishing silicon nitride with a small number of defects.

A polishing composition contains: abrasives having a positive zeta potential; and a cyclic compound having a mother nucleus with a ring structure and two or more anionic functional groups bonded to the mother nucleus, in which the abrasives contain silica. This polishing composition is used for polishing objects to be polished containing silicon oxide and silicon nitride.

14 Claims, No Drawings

POLISHING COMPOSITION AND POLISHING METHOD

TECHNICAL FIELD

The present invention relates to a polishing composition and a polishing method.

BACKGROUND ART

A polishing composition used for chemical mechanical polishing (CMP) of semiconductor substrates is sometimes required to have performance of polishing a silicon oxide film and a silicon nitride film at the same polishing removal rate (low selectivity) and performance of polishing the silicon nitride film with a small number of defects (low defect). As the defects, abrasive residues in the silicon nitride film are particularly problematic.

CITATION LIST

Patent Literature

PTL 1: JP 2019-57615 A

SUMMARY OF INVENTION

Technical Problem

Some conventional polishing compositions have satisfied one of the performance of low selectivity or the performance of low defect but no conventional polishing compositions sufficiently have satisfied both the performance. For example, a polishing composition containing abrasives having a positive zeta potential has had the performance of low defect, but the performance of low selectivity has been insufficient due to a low polishing removal rate of the silicon nitride film.

It is an object of the present invention to provide a polishing composition capable of improving the polishing removal rate of silicon nitride to polish silicon oxide and silicon nitride at the same polishing removal rate and polishing silicon nitride with a small number of defects and a polishing method.

Solution to Problem

A polishing composition according to one aspect of the present invention contains: abrasives having a positive zeta potential; and a cyclic compound having a mother nucleus with a ring structure and two or more anionic functional groups bonded to the mother nucleus, in which the abrasives contain silica.

A polishing method according to another aspect of the present invention includes polishing an object to be polished containing silicon nitride using the polishing composition according to one aspect described above.

A polishing method according to still another aspect of the present invention includes polishing an object to be polished containing silicon oxide and silicon nitride using the polishing composition according to one aspect described above.

Advantageous Effects of Invention

The present invention can improve the polishing removal rate of silicon nitride to polish silicon oxide and silicon nitride at the same polishing removal rate and polish silicon nitride with a small number of defects.

DESCRIPTION OF EMBODIMENTS

One embodiment of the present invention will now be described in detail. The embodiment described below describes an example of the present invention and the present invention is not limited to this embodiment. Further, the embodiment described below can be variously altered or modified and embodiments obtained by such alternations or modifications may also be included in the present invention.

A polishing composition according to this embodiment is a polishing composition used for polishing objects to be polished containing silicon nitride (for example, $Si_3N_4$) or objects to be polished containing silicon oxide (for example, $SiO_2$) and silicon nitride, and contains abrasives and a cyclic compound. The abrasives contain silica and have a positive zeta potential. The cyclic compound is added as an additive and is a compound having a mother nucleus with a ring structure and two or more anionic functional groups bonded to the mother nucleus.

A polishing method according to this embodiment is a method including polishing objects to be polished containing silicon nitride using the polishing composition according to this embodiment described above. When the polishing of the objects to be polished containing silicon nitride is performed using the polishing composition according to this embodiment described above, the polishing removal rate of the silicon nitride can be improved.

A polishing method according to this embodiment is a method including polishing objects to be polished containing silicon oxide and silicon nitride using the polishing composition according to this embodiment described above. When the polishing of the objects to be polished containing silicon oxide and silicon nitride is performed using the polishing composition according to this embodiment described above, the polishing removal rate of the silicon nitride can be improved, and thus, the silicon oxide and the silicon nitride can be polished at the same polishing removal rate when polished under the same conditions, and the silicon nitride can be polished with a small number of defects.

Hereinafter, the polishing composition and the polishing method according to this embodiment are described in detail.

1. Objects to be Polished

The objects to be polished applicable to the polishing using the polishing composition according to this embodiment are not particularly limited insofar as silicon nitride is contained or silicon oxide and silicon nitride are contained. For example, a substrate having a surface on which a silicon oxide film and a silicon nitride film are formed is mentioned. Materials of the substrate are not particularly limited, and include simple substance silicon, silicon compounds, metals, ceramic, resin, and the like.

The simple substance silicon includes, for example, single crystal silicon, polysilicon (polycrystalline silicon), amorphous silicon, and the like. The silicon compounds include, for example, silicon nitride, silicon oxide (for example, a silicon dioxide interlayer insulating film formed using tetraethoxysilane (TEOS) as a raw material), silicon carbide, and the like.

The metals include, for example, tungsten, copper, aluminum, hafnium, cobalt, nickel, titanium, tantalum, gold, silver, platinum, palladium, rhodium, ruthenium, iridium, osmium, and the like. These metals may be contained in the form of an alloy or a metal compound.

Specific examples of such objects to be polished include a silicon wafer with a film in which a silicon oxide film is deposited on a silicon nitride film.

2. Abrasives

The polishing composition according to this embodiment contains abrasives containing silica and having a positive zeta potential. When abrasives having a negative zeta potential are contained in the polishing composition, the polishing removal rate of silicon nitride is likely to be improved, but the performance of low defect is less likely to be exhibited. In contrast thereto, when the abrasives having a positive zeta potential are contained in the polishing composition, the performance of low defect is likely to be exhibited. Hence, when the objects to be polished containing silicon nitride are polished using the polishing composition according to this embodiment, the silicon nitride can be polished with a small number of defects.

The type of the abrasives contained in the polishing composition according to this embodiment is not particularly limited insofar as the abrasives contain silica and the surface potential has a positive zeta potential in the polishing composition, and colloidal silica, fumed silica, sol-gel process silica, precipitation process silica, and the like are preferable. Among these silicas, colloidal silica and fumed silica are more preferable from the viewpoint of reducing scratches generated on polished surfaces of the objects to be polished. Among colloidal silicas, cocoon-shaped colloidal silica (for example, the shape of a rotating body obtained by rotating an oval around the major axis) is still more preferable from the viewpoint of obtaining a high polishing removal rate. These silicas may be used alone or in combination of two or more types thereof.

Further, by cationizing the surface of the abrasives, a positive zeta potential can be imparted to the abrasives. For example, when the surface of the colloidal silica is cationized using an amino silane coupling agent (for example, 3-aminopropyltriethoxysilane), colloidal silica having a positive zeta potential can be obtained. By the amino silane coupling agent, an amino group is chemically bonded to the surface of the abrasives, and therefore a positive zeta potential is imparted to the abrasives.

The zeta potential of the abrasives contained in the polishing composition according to this embodiment is positive. From the viewpoint of obtaining a desired polishing removal rate, the zeta potential of the abrasives is preferably 1 mV or more, more preferably 2 mV or more, and still more preferably 5 mV or more. The zeta potential of the abrasives is preferably 150 mV or less, more preferably 100 mV or less, and still more preferably 50 mV or less.

The average primary particle diameter of the abrasives is preferably set to 5 nm or more, more preferably set to 7 nm or more, and still more preferably set to 10 nm or more. As the average primary particle diameter of the abrasives increases, the polishing removal rate of the objects to be polished by the polishing composition is improved.

The average primary particle diameter of the abrasives is preferably set to 200 nm or less, more preferably set to 150 nm or less, and still more preferably set to 100 nm or less. As the average primary particle diameter of the abrasives decreases, a polished surface with less surface defects, such as dishing, is likely to be obtained.

The value of the average primary particle diameter of the abrasives can be calculated based on, for example, the specific surface area of the abrasives measured by the BET method using nitrogen gas or the like. In the case of non-spherical abrasives, such as the cocoon-shaped colloidal silica, the average primary particle diameter of virtual spherical particles is calculated based on the specific surface area of the abrasives measured by the BET method. Therefore, the average primary particle diameter of the virtual spherical particles is defined as the average primary particle diameter of the non-spherical abrasives.

The average secondary particle diameter of the abrasives is preferably set to 25 nm or more, more preferably set to 30 nm or more, and still more preferably set to 35 nm or more. As the average secondary particle diameter of the abrasives increases, the polishing removal rate of the objects to be polished by the polishing composition is improved.

The average secondary particle diameter of the abrasives is preferably set to 300 nm or less, more preferably set to 260 nm or less, and still more preferably set to 220 nm or less. As the average secondary particle diameter of the abrasives decreases, a polished surface with less surface defects, such as dishing, is likely to be obtained.

The average secondary particle diameter of the abrasives can be measured by, for example, a dynamic light scattering method. The value of the average secondary particle diameter of the abrasives can also be measured using a laser diffraction/scattering particle diameter distribution analyzer (for example, "LA-950" manufactured by HORIBA, Ltd.).

The content of the abrasives in the polishing composition according to this embodiment is not particularly limited and is preferably set to 0.005% by mass or more, more preferably set to 0.05% by mass or more, still more preferably set to 0.5% by mass or more, and particularly preferably set to 0.75% by mass or more. As the content of the abrasives in the polishing composition increases, the polishing removal rate of the objects to be polished by the polishing composition is improved.

The content of the abrasives in the polishing composition is preferably set to 20% by mass or less, more preferably set to 10% by mass or less, still more preferably set to 5% by mass or less, and particularly preferably set to 3% by mass or less. As the content of the abrasives in the polishing composition decreases, a polished surface with less surface defects, such as dishing, is likely to be obtained. The material cost of the polishing composition can be reduced, and, in addition thereto, the aggregation of the abrasives is less likely to occur.

3. Cyclic Compound

The cyclic compound contained in the polishing composition according to this embodiment is an additive to be added to the polishing composition as a silicon nitride polishing removal accelerator improving the polishing removal rate of the silicon nitride. The chemical action of the cyclic compound improves the polishing removal rate of the silicon nitride.

The type of this cyclic compound is not particularly limited insofar as it is a compound having a mother nucleus with a ring structure and two or more anionic functional groups bonded to the mother nucleus, and a compound is more preferable which has a mother nucleus with a ring structure and three or more anionic functional groups bonded to the mother nucleus.

The type of the mother nucleus with a ring structure is not particularly limited and may be an aromatic hydrocarbon group with a benzene ring, a naphthalene ring, a pyrene ($C_{16}H_{10}$) ring, or the like, an alicyclic hydrocarbon group with a cyclohexane ring or the like, or a heterocyclic group with a tetrahydrofuran ring or the like. Further, the number of ring members of the mother nucleus with a ring structure is not particularly limited.

The type of the anionic functional group contained in the cyclic compound is not particularly limited, and a carboxy group, a sulfo group, and a phosphonic acid group are mentioned, for example, and a carboxy group and a sulfo group are more preferable. At least one of the plurality of anionic functional groups contained in the cyclic compound is preferably at least one of a carboxy group and a sulfo group.

Specific examples of the cyclic compound having a carboxy group include phthalic acid, isophthalic acid, terephthalic acid, 1,3,5-benzenetricarboxylic acid, hemimellitic acid, trimellitic acid, pyromellitic acid, benzenepentacarboxylic acid, mellitic acid, 2,5-hydrofurandicarboxylic acid, 3,4-pyridinedicarboxylic acid, 3,5-pyridinedicarboxylic acid, 2,3-pyridinedicarboxylic acid, 2,4-pyridinedicarboxylic acid, 2,5-pyridinedicarboxylic acid, 2,6-pyridinedicarboxylic acid, 1H-imidazole-4,5-dicarboxylic acid, pyrazole-3,5-dicarboxylic acid, 1,4-naphthalenedicarboxylic acid, 2,3-naphthalenedicarboxylic acid, 2,6-naphthalenedicarboxylic acid, 1,4,5,8-naphthalenetetracarboxylic acid, cis-cyclohexene-1,2-dicarboxylic acid, 1,3-cyclohexanedicarboxylic acid, 1,4-cyclohexanedicarboxylic acid, 1,3,5-cyclohexanetricarboxylic acid, 1,2,3,4-cyclobutanetetracarboxylic acid, 1,2,3,4-cyclopentanetetracarboxylic acid, tetrahydrofuran-2,3,4,5-tetracarboxylic acid, 1,2,3,4,5,6-cyclohexanehexacarboxylic acid, and salts thereof.

Specific examples of the cyclic compound having a sulfo group include 1,2-benzenedisulfonic acid, 1,3-benzenedisulfonic acid, 1,4-benzenedisulfonic acid, aniline-2,5-benzenedisulfonic acid, 1,2-dihydroxybenzene-3,5-disulfonic acid, 4-formylbenzene-1,3-disulfonic acid, 1,3-naphthalenedisulfonic acid, 1,5-naphthalenedisulfonic acid, 1,6-naphthalenedisulfonic acid, 2,6-naphthalenedisulfonic acid, 2,7-naphthalenedisulfonic acid, 2-naphthol-6,8-disulfonic acid, naphthalene-1,3,5-trisulfonic acid, 1,3,6-naphthalenetrisulfonic acid, 7-amino-naphthalene-1,3,6-trisulfonic acid, 8-amino-naphthalene-1,3,6-trisulfonic acid, 8-aminopyrene-1,3,6-trisulfonic acid, 1-acetoxypyrene-3,6,8-trisulfonic acid, indigodisulfonic acid, indigotrisulfonic acid, indigotetrasulfonic acid, tris(3-sulfophenyl)phosphine, 8-hydroxypyrene-1,3,6-trisulfonic acid, and salts thereof.

Among the above, 1,3,5-benzenetricarboxylic acid, hemimellitic acid, trimellitic acid, pyromellitic acid, benzenepentacarboxylic acid, mellitic acid, 2,5-hydrofurandicarboxylic acid, 3,4-pyridinedicarboxylic acid, 3,5-pyridinedicarboxylic acid, 2,3-pyridinedicarboxylic acid, 2,4-pyridinedicarboxylic acid, 2,5-pyridinedicarboxylic acid, 2,6-pyridinedicarboxylic acid, 1H-imidazole-4,5-dicarboxylic acid, pyrazole-3,5-dicarboxylic acid, 1,4-naphthalenedicarboxylic acid, 2,3-naphthalenedicarboxylic acid, 2,6-naphthalenedicarboxylic acid, 1,4,5,8-naphthalenetetracarboxylic acid, cis-cyclohexene-1,2-dicarboxylic acid, 1,3-cyclohexanedicarboxylic acid, 1,4-cyclohexanedicarboxylic acid, 1,3,5-cyclohexanetricarboxylic acid, 1,2,3,4-cyclobutanetetracarboxylic acid, 1,2,3,4-cyclopentanetetracarboxylic acid, tetrahydrofuran-2,3,4,5-tetracarboxylic acid, 1,2,3,4,5,6-cyclohexanehexacarboxylic acid, 1,3-benzenedisulfonic acid, naphthalene-1,3,5-trisulfonic acid, 1,3,6-naphthalenetrisulfonic acid, 7-amino-naphthalene-1,3,6-trisulfonic acid, 8-amino-naphthalene-1,3,6-trisulfonic acid, 8-aminopyrene-1,3,6-trisulfonic acid, 1-acetoxypyrene-3,6,8-trisulfonic acid, indigodisulfonic acid, indigotrisulfonic acid, indigotetrasulfonic acid, tris(3-sulfophenyl)phosphine, 8-hydroxypyrene-1,3,6-trisulfonic acid, and salts thereof are preferable and 1,3,5-benzenetricarboxylic acid, hemimellitic acid, trimellitic acid, pyromellitic acid, benzenepentacarboxylic acid, mellitic acid, 1,4-naphthalenedicarboxylic acid, 2,3-naphthalenedicarboxylic acid, 2,6-naphthalenedicarboxylic acid, 1,4,5,8-naphthalenetetracarboxylic acid, cis-cyclohexene-1,2-dicarboxylic acid, 1,3-cyclohexanedicarboxylic acid, 1,4-cyclohexanedicarboxylic acid, 1,3,5-cyclohexanetricarboxylic acid, 1,2,3,4-cyclobutanetetracarboxylic acid, 1,2,3,4-cyclopentanetetracarboxylic acid, tetrahydrofuran-2,3,4,5-tetracarboxylic acid, 1,2,3,4,5,6-cyclohexanehexacarboxylic acid, 1,3-benzenedisulfonic acid, 1,3,6-naphthalenetrisulfonic acid, 7-amino-naphthalene-1,3,6-trisulfonic acid, 8-hydroxypyrene-1,3,6-trisulfonic acid are more preferable.

These cyclic compounds may be used alone or in combination of two or more types thereof.

The content of the cyclic compound in the polishing composition according to this embodiment is not particularly limited and is preferably 1 mmol/L or more, more preferably 2 mmol/L or more, and still more preferably 3 mmol/L or more. The content of the cyclic compound in the polishing composition according to this embodiment is preferably 20 mmol/L or less, more preferably 15 mmol/L or less, and still more preferably 10 mmol/L or less. When the content of the cyclic compound is within the ranges above, the polishing removal rate of the silicon nitride is improved, so that the silicon oxide and the silicon nitride can be polished at the same polishing removal rate when polished under the same conditions.

4. pH

The pH of the polishing composition according to this embodiment is not particularly limited and is preferably less than 7 (i.e., preferably acidic). Due to the fact that the pH of the polishing composition is less than 7, the polishing removal rate of the silicon nitride is further improved. As described above, the polishing removal rate of the silicon nitride is also improved by the chemical action of the cyclic compound.

As a result, the polishing removal rate of the silicon nitride, which is difficult to polish, is improved. Therefore, the silicon oxide and the silicon nitride can be polished at the same polishing removal rate when polished under the same conditions. The pH of the polishing composition according to this embodiment is more preferably 1 or more, still more preferably 2 or more, yet still more preferably 2.5 or more, and particularly preferably 3 or more. The pH of the polishing composition according to this embodiment is more preferably 6 or less, still more preferably 5 or less, and particularly preferably 4.5 or less.

The pH of the polishing composition according to this embodiment may be adjusted by a pH adjuster as an additive. The pH adjuster may be used alone or in combination of two or more types thereof.

5. Polishing Composition

The polishing composition according to this embodiment is a slurry containing the abrasives and the cyclic compound described above and a liquid medium. The liquid medium functions as a dispersion medium or a solvent dispersing the abrasives and dispersing or dissolving the cyclic compound. The liquid medium includes water and organic solvents, and the liquid medium can be used alone or as a mixture of two or more types thereof, and the liquid medium preferably contains water. However, from the viewpoint of suppressing the inhibition of the action of each component constituting the polishing composition according to this embodiment, water containing as little impurities as possible is preferably used. Specifically, pure water or ultrapure water obtained by removing impurity ions with an ion exchange resin, and then removing contaminants through a filter or distilled water is preferable.

6. Additives Other than Cyclic Compound

To the polishing composition according to this embodiment, known additives contained in common polishing compositions may be further added as necessary to improve the performance thereof. For example, various additives, such as pH adjusters, oxidants, surfactants, water-soluble polymers, anticorrosive agents, chelating agents, dispersion aids, antiseptic agents, and antifungal agents, may be added.

6-1. pH Adjuster

To the polishing composition according to this embodiment, a pH adjuster may be added as necessary to adjust the pH to a desired value. As the pH adjuster, known acids, bases, or salts thereof are usable.

Specific examples of acids usable as the pH adjuster include inorganic acids, such as hydrochloric acid, sulfuric acid, nitric acid, hydrofluoric acid, boric acid, carbonic acid, hypophosphorous acid, phosphorous acid, and phosphoric acid, and organic acids, such as formic acid, acetic acid, propionic acid, butyric acid, valeric acid, 2-methylbutyric acid, n-hexanoic acid, 3,3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimellic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, and phenoxyacetic acid.

When the inorganic acids are used as the pH adjuster, sulfuric acid, nitric acid, hydrochloric acid, phosphoric acid, and the like are preferable from the viewpoint of improving the polishing removal rate. When the organic acids are used as the pH adjuster, glycolic acid, succinic acid, maleic acid, citric acid, tartaric acid, malic acid, gluconic acid, itaconic acid, and the like are preferable.

Bases usable as the pH adjuster include amines, such as aliphatic amines and aromatic amines, organic bases such as tetraammonium hydroxide, hydroxides of alkali metals, such as potassium hydroxide, and hydroxides of alkaline earth metals, ammonia, and the like. Among these bases, potassium hydroxide and ammonia are preferable in terms of ease of availability.

Further, in place of the acids or in combination with the acids, salts, such as ammonium salts or alkali metal salts of the acids, may be used as the pH adjuster. In particular, in the case of salts of weak acids and strong bases, salts of strong acids and weak bases, or salts of weak acids and weak bases, a pH buffer action can be expected, and, in the case of salts of strong acids and strong bases, not only the pH but the electrical conductivity can be adjusted with a small amount of the salts.

The addition amount of the pH adjuster is not particularly limited and may be adjusted as appropriate such that the polishing composition has a desired pH.

6-2. Oxidant

To the polishing composition according to this embodiment, an oxidant may be added as necessary to oxidize the surface of the objects to be polished. The oxidant has an action of oxidizing the surface of the objects to be polished. When the oxidant is added to the polishing composition, an improvement effect of the polishing removal rate by the polishing composition is obtained.

Usable oxidants are peroxides, for example. Specific examples of the peroxides include hydrogen peroxide, peracetic acid, percarbonate, urea peroxide, perchloric acid, persulfate (for example, sodium persulfate, potassium persulfate, ammonium persulfate), and the like.

6-3. Surfactant

To the polishing composition according to this embodiment, a surfactant may be added. The surfactant has an action of imparting hydrophilicity to polished surfaces of the objects to be polished after polishing, and therefore the cleaning efficiency of the objects to be polished after polishing can be improved and the adhesion of dirt and the like can be suppressed. As the surfactant, any of anionic surfactants, cationic surfactants, amphoteric surfactants, and nonionic surfactants is usable.

Specific examples of the anionic surfactants include polyoxyethylene alkyl ether acetate, polyoxyethylene alkyl sulfate ester, alkyl sulfate ester, polyoxyethylene alkyl sulfate, alkyl sulfate, alkylbenzene sulfonate, alkyl phosphate ester, polyoxyethylene alkyl phosphate ester, polyoxyethylene sulfosuccinate, alkyl sulfosuccinate, alkylnaphthalene sulfonate, alkyldiphenyl ether disulfonate, or salts thereof.

Specific examples of the cationic surfactants include alkyltrimethylammonium salts, alkyldimethylammonium salts, alkylbenzyldimethylammonium salts, and alkylamine salts.

Specific examples of the amphoteric surfactants include alkyl betaines and alkyl amine oxides.

Specific examples of the nonionic surfactants include polyoxyethylene alkyl ethers, polyoxyalkylene alkyl ethers, sorbitan fatty acid esters, glycerin fatty acid esters, polyoxyethylene fatty acid esters, polyoxyethylene alkyl amines, and alkyl alkanolamides.

6-4. Water Soluble Polymer

To the polishing composition according to this embodiment, a water-soluble polymer may be added. The type of the water-soluble polymer is not particularly limited. Examples of the water-soluble polymer include celluloses, such as methyl cellulose, methyl hydroxyethyl cellulose, methyl hydroxypropyl cellulose, hydroxyethyl cellulose, hydroxypropyl cellulose, carboxymethyl cellulose, carboxyethyl cellulose, and carboxymethyl hydroxyethyl cellulose, polysaccharides, such as chitosan, and polymers, such as polyethylene glycol, polyethyleneimine, poly-N-vinylpyrrolidone, polyvinyl alcohol, polyacrylic acid (or salts thereof), polyacrylamide, and polyethylene oxide.

6-5. Anticorrosive Agent

To the polishing composition according to this embodiment, an anticorrosive agent may be added as necessary to suppress the corrosion of the surface of the objects to be polished. Specific examples of the anticorrosive agent include amines, pyridines, tetraphenylphosphonium salts, benzotriazoles, triazoles, tetrazoles, benzoic acids, and the like.

6-6. Chelating Agent

To the polishing composition according to this embodiment, a chelating agent may be added as necessary to suppress metal contamination of the objects to be polished by capturing metal impurity components in the polishing system and forming a complex. Specific examples of the chelating agent include carboxylic acids, amines, organic phosphonic acids, amino acids, and the like.

6-7. Dispersion Aid

To the polishing composition according to this embodiment, a dispersion aid may be added, as necessary, to facilitate the re-dispersion of aggregates of the abrasives.

Specific examples of the dispersion aid include condensed phosphates, such as pyrophosphate and hexametaphosphate.

6-8 Antiseptic Agent, Antifungal Agent

An antiseptic agent or an antifungal agent may be added, as necessary, to the polishing composition according to this embodiment. The antiseptic agent, the antifungal agent include, for example, isothiazolin-based antiseptic agents, such as 2-methyl-4-isothiazolin-3-one and 5-chloro-2-methyl-4-isothiazolin-3-one, paraoxybenzoic acid esters, and phenoxyethanol.

7. Method for Manufacturing Polishing Composition

A method for manufacturing the polishing composition according to this embodiment is not particularly limited. The polishing composition according to this embodiment can be manufactured by stirring and mixing the abrasives, the cyclic compound, and, as desired, various additives in a liquid medium, such as water. The temperature at which the components are mixed is not particularly limited and is preferably 10° C. or higher and 40° C. or lower, and may be increased to improve the dissolution rate. The mixing time is also not particularly limited.

The polishing composition according to this embodiment may be a one-agent type or may be a multi-agent type, such as two or more-agent type, in which some or all of the components of the polishing composition are mixed at an arbitrary ratio. The polishing composition according to this embodiment may be prepared by diluting a liquid concentrate of the polishing composition with water 10-fold or more, for example. When the polishing composition is a two-agent type, the order of the mixing and the dilution of two raw material compositions serving as the raw materials of the polishing composition is arbitrarily set. For example, one raw material composition may be diluted with water, and then mixed with the other raw material composition, the mixing and the dilution with water of both the raw material compositions may be performed at the same time, or both the raw material compositions may be mixed, and then diluted with water.

8. Polishing Apparatus and Polishing Method

Methods and conditions for polishing the objects to be polished containing silicon nitride or the objects to be polished containing silicon oxide and silicon nitride using the polishing composition according to this embodiment are not particularly limited. The polishing may be performed by selecting methods and conditions suitable for the polishing of the objects to be polished as appropriate within the range of common polishing methods and conditions. As a polishing apparatus, a common single-sided polishing apparatus or double-sided polishing apparatus is usable.

When the polishing is performed using a single-sided polishing apparatus, the object to be polished is held using a holding tool referred to as a carrier, the polishing composition is interposed between the object to be polished and a polishing pad, a platen to which the polishing pad is stuck is pressed against one side of the object to be polished, and then the platen is rotated, thereby polishing the one side of the object to be polished.

When the polishing is performed using a double-sided polishing apparatus, the object to be polished is held using a carrier, the polishing composition is interposed between the object to be polished and a polishing pad, a platen to which the polishing pad is stuck is pressed against both sides of the object to be polished, and then the polishing pad and the object to be polished are rotated in opposite directions, thereby polishing both the sides of the object to be polished.

Regardless of which polishing apparatus is used, the object to be polished is polished by the physical action due to friction between the polishing pad and the polishing composition and the object to be polished and the chemical action given to the object to be polished by the polishing composition.

The type of the polishing pad is not particularly limited, and a foamed body may be acceptable and a non-foamed body, such as cloth and non-woven fabric, may be acceptable, and common non-woven fabric, foamed polyurethane, porous fluororesin, and the like are usable. The polishing pad may be grooved to form a groove where the polishing composition is collected.

EXAMPLES

Hereinafter, the present invention is more specifically described by illustrating Examples and Comparative Examples.

Abrasives, additives, and water were mixed, and then a pH adjuster (nitric acid or potassium hydroxide aqueous solution) was added to adjust the pH as shown in Table 1, thereby manufacturing polishing compositions of Examples 1 to 11 and Comparative Examples 1 to 19 (see Table 1). The physical properties of the polishing compositions were measured as follows.

(pH of Polishing Composition)

The pH of the polishing composition was measured using a glass electrode type hydrogen ion concentration indicator (Model number F-23) manufactured by HORIBA, Ltd. First, the glass electrode type hydrogen ion concentration indicator was subjected to three-point calibration using standard buffer solutions (a phthalate pH buffer solution, pH: 4.01 (25° C.), a neutral phosphate pH buffer solution, pH: 6.86 (25° C.), a carbonate pH buffer solution, pH: 10.01 (25° C.)). Thereafter, the glass electrode of the glass electrode type hydrogen ion concentration indicator was put into the polishing composition, and a value after being stabilized after the lapse of 2 minutes or more was read, thereby measuring the pH.

(Electrical Conductivity of Polishing Composition)

The electrical conductivity (mS/cm) of the polishing composition was measured by an electrical conductivity meter (model number DS-71) manufactured by HORIBA, Ltd.

(Zeta Potential of Polishing Composition)

The zeta potential (mV) of the abrasives in the polishing composition was measured by a zeta potential/particle diameter measurement system ELS-Z2 manufactured by Otsuka Electronics Co., Ltd. In detail, the polishing composition was subjected to the zeta potential/particle diameter measurement system, the measurement was performed by a laser doppler method (electrophoretic light scattering measurement method) using a flow cell at a measurement temperature of 25° C., and then the obtained data was analyzed by the Smoluchowski formula, thereby calculating the zeta potential.

The abrasives contain colloidal silica with an average primary particle diameter of 35 nm and an average secondary particle diameter of 70 nm and have a particle shape of a cocoon shape. The concentration of the abrasives in the polishing composition is 1% by mass. The abrasives used in the polishing compositions of Examples 1 to 8 and Comparative Examples 1 to 14 contain cation-modified colloidal silica cationized using 3-aminopropyltriethoxysilane, and the zeta potential of the abrasives is as shown in Table 1. The abrasives used in the polishing compositions of Comparative Examples 16 to 19 contain anion-modified colloidal silica having a sulfo group on the surface, and the zeta potential of the abrasives is as shown in Table 1. The abrasives used in the polishing compositions of Examples 9 to 11 and Comparative Example 15 contain untreated and unmodified colloidal silica, and the zeta potential of the abrasives is as shown in Table 1.

The additives are compounds having anionic functional groups (carboxy group or sulfo group) (see Table 1). The additives used in the polishing compositions of Examples 1 to 11 and Comparative Examples 17 to 19 are cyclic compounds having a mother nucleus with a ring structure and two or more anionic functional groups bonded to the mother nucleus. The additives used in the polishing compositions of Comparative Examples 6, 7 are compounds having a mother nucleus with a ring structure and one anionic functional group bonded to the mother nucleus. The additives used in the polishing compositions of Comparative Examples 2 to 5 and Comparative Examples 8 to 14 are compounds having a mother nucleus not having a ring structure and one or two or more anionic functional groups bonded to the mother nucleus.

The concentration of the additives in the polishing compositions is 5.0 mmol/L. However, for the polishing composition of Example 4, the concentration was set to the concentration of 1 g of the additive per 1 kg of the polishing composition (0.1% by mass) due to low solubility of the additive.

TABLE 1

| | | Abrasives | | Additive | | |
|---|---|---|---|---|---|---|
| | | Treatment contents | Zeta potential (mV) | Type | Functional group | Number of functional groups |
| Comp. Ex. 1 | | Cationized | 37.8 | — | — | — |
| Examples | 1 | Cationized | 12.6 | Disodium 1,3-benzene disulfonate | Sulfo group | 2 |
| | 2 | Cationized | 9.6 | Trisodium 1,3,6-naphthalene trisulfonate | Sulfo group | 3 |
| | 3 | Cationized | 8.8 | Dipotassium 7-amino-naphthalene-1,3,6-trisulfonate | Sulfo group | 3 |
| | 4 | Cationized | 14.0 | Trisodium 8-hydroxypyrene-1,3,6-trisulfonate | Sulfo group | 3 |
| | 5 | Cationized | 13.5 | Tetrahydrofuran-2,3,4,5-tetracarboxylic acid | Carboxy group | 4 |
| | 6 | Cationized | 16.7 | 1,2,3,4,5,6-cyclohexanehexacarboxylic acid monohydrate | Carboxy group | 6 |
| | 7 | Cationized | 15.0 | Trisodium 1,3,6-naphthalene trisulfonate | Sulfo group | 3 |
| | 8 | Cationized | 8.2 | Trisodium 1,3,6-naphthalene trisulfonate | Sulfo group | 3 |
| Comparative Examples | 2 | Cationized | 27.8 | L-(+)-tartaric acid | Carboxy group | 2 |
| | 3 | Cationized | 16.1 | Methandisulfonic acid | Sulfo group | 2 |
| | 4 | Cationized | 16.1 | 1,2-ethandisulfonic acid | Sulfo group | 2 |
| | 5 | Cationized | 16.5 | 1,3-propanedisulfonic acid | Sulfo group | 2 |
| | 6 | Cationized | 27.1 | Benzenesulfonic acid monohydrate | Sulfo group | 1 |
| | 7 | Cationized | 23.1 | 2-naphthalenesulfonic acid | Sulfo group | 1 |
| | 8 | Cationized | 14.0 | Bis-(sodium sulfopropyl)disulfide | Sulfo group | 2 |
| | 9 | Cationized | 15.8 | Sodium tetrathionate dihydrate | Sulfo group | 2 |
| | 10 | Cationized | 5.8 | Triammonium citrate | Carboxy group | 3 |
| | 11 | Cationized | 33.6 | Glyceric acid | Carboxy group | 1 |
| | 12 | Cationized | 28.9 | 1,2,3-propane tricarboxylic acid | Carboxy group | 3 |
| | 13 | Cationized | 26.3 | Trans-aconitic acid | Carboxy group | 3 |
| | 14 | Cationized | 31.0 | Meso-butane-1,2,3,4-tetracarboxylic acid | Carboxy group | 4 |
| | 15 | Untreated | 6.7 | — | — | — |
| Examples | 9 | Untreated | 4.8 | Trisodium 1,3,6-naphthalene trisulfonate | Sulfo group | 3 |
| | 10 | Untreated | 3.4 | 1,2,3,4,5,6-cyclohexanehexacarboxylic acid monohydrate | Carboxy group | 6 |
| | 11 | Untreated | 4.1 | Tetrahydrofuran-2,3,4,5-tetracarboxylic acid | Carboxy group | 4 |
| Comparative Examples | 16 | Anionized | −42.3 | — | — | — |
| | 17 | Anionized | −28.5 | 1,2,3,4,5,6-cyclohexanehexacarboxylic acid monohydrate | Carboxy group | 6 |
| | 18 | Anionized | −25.7 | Trisodium 1,3,6-naphthalene trisulfonate | Sulfo group | 3 |
| | 19 | Anionized | −35.6 | Tetrahydrofuran-2,3,4,5-tetracarboxylic acid | Carboxy group | 4 |

| | | pH | Electrical conductivity (mS/cm) | Polishing removal rate (Å/min) Silicon oxide | Polishing removal rate (Å/min) Silicon nitride | Polishing removal rate ratio | Polishing removal rate improvement rate | Number of defects (pieces) |
|---|---|---|---|---|---|---|---|---|
| Comp. Ex. 1 | | 3.5 | 0.20 | 249.7 | 2.9 | 0.01 | 1.0 | |
| Examples | 1 | 3.5 | 1.80 | 87.9 | 39.8 | 0.45 | 13.7 | |
| | 2 | 3.5 | 1.67 | 101.9 | 112.1 | 1.10 | 38.7 | 218 |
| | 3 | 3.5 | 1.86 | 69.6 | 98.2 | 1.41 | 33.9 | |
| | 4 | 3.5 | 0.88 | 126.9 | 60.5 | 0.48 | 20.9 | |
| | 5 | 3.5 | 0.89 | 66.9 | 94.9 | 1.42 | 32.7 | 100 |
| | 6 | 3.5 | 1.34 | 67.3 | 114.7 | 1.70 | 39.6 | |
| | 7 | 4.0 | 1.59 | 177.0 | 87.2 | 0.49 | 30.1 | |
| | 8 | 4.5 | 1.55 | 294.1 | 60.5 | 0.21 | 20.9 | |
| Comparative Examples | 2 | 3.5 | 0.57 | 103.1 | 37.4 | 0.36 | 12.9 | |
| | 3 | 3.5 | 1.46 | 88.8 | 14.1 | 0.16 | 4.9 | |
| | 4 | 3.5 | 1.20 | 96.6 | 17.4 | 0.18 | 6.0 | |
| | 5 | 3.5 | 1.31 | 90.1 | 17.2 | 0.19 | 5.9 | |
| | 6 | 3.5 | 0.61 | 116.9 | 16.0 | 0.14 | 5.5 | |
| | 7 | 3.5 | 0.52 | 156.2 | 14.3 | 0.09 | 4.9 | |
| | 8 | 3.5 | 1.02 | 126.4 | 11.0 | 0.09 | 3.8 | |
| | 9 | 3.5 | 1.23 | 97.1 | 14.0 | 0.14 | 4.8 | |

TABLE 1-continued

|  |  |  |  |  |  |  |  |  |
|---|---|---|---|---|---|---|---|---|
|  | 10 | 3.5 | 2.03 | 62.3 | 20.6 | 0.33 | 7.1 |  |
|  | 11 | 3.5 | 0.32 | 234.3 | 4.8 | 0.02 | 1.7 |  |
|  | 12 | 3.5 | 0.30 | 137.1 | 9.9 | 0.07 | 3.4 |  |
|  | 13 | 3.5 | 0.59 | 71.3 | 13.9 | 0.19 | 4.8 |  |
|  | 14 | 3.5 | 0.40 | 64.6 | 5.3 | 0.08 | 1.8 |  |
|  | 15 | 3.5 | 0.16 | 30.8 | 71.9 | 2.33 | 1.0 |  |
| Examples | 9 | 3.5 | 1.65 | 86.8 | 97.0 | 1.12 | 1.3 |  |
|  | 10 | 3.5 | 1.30 | 82.6 | 85.7 | 1.04 | 1.2 |  |
|  | 11 | 3.5 | 0.89 |  |  |  |  | 177 |
| Comparative | 16 | 3.5 | 0.19 | 7.2 | 130.6 | 18.17 | 1.0 |  |
| Examples | 17 | 3.5 | 1.36 | 25.4 | 30.0 | 1.18 | 0.2 |  |
|  | 18 | 3.5 | 1.93 |  |  |  |  | 584 |
|  | 19 | 3.5 | 0.91 |  |  |  |  | 343 |

Next, using the 30 types of polishing compositions above, objects to be polished were individually polished. The objects to be polished are a silicon wafer with a silicon nitride film and a silicon wafer with a silicon oxide film (a silicon dioxide interlayer insulating film formed using tetraethoxysilane (TEOS) as a raw material). The diameter of each wafer is 200 mm, and the polishing conditions are as follows.

Polishing apparatus: One side CMP polishing apparatus for 200 mm wafer, Mirra manufactured by Applied Materials, Inc.
Pad: Polyurethane pad
Polishing pressure: 2 psi (about 13.8 kPa)
Rotational speed of polishing head: 47 min$^{-1}$
Rotational speed of platen: 43 min$^{-1}$
Supply flow rate of polishing composition: 200 mL/min <Polishing Removal Rate>

The wafers were individually measured for the film thicknesses before and after the polishing using an optical interferometry film thickness meter. Then, the polishing removal rates of the silicon nitride film and the silicon oxide film were individually calculated from the film thickness difference and the polishing time. The results are shown in Table 1. Then, the ratio between the polishing removal rates of the silicon oxide and the silicon nitride ([Polishing removal rate of silicon nitride]/[Polishing removal rate of silicon oxide]) was calculated and also shown in Table 1. The polishing removal rate ratio indicates the level (high or low) of the performance of the low selectivity.

Further, based on the polishing removal rate of the silicon nitride in Comparative Example 1, the polishing removal rate improvement rate indicating the degree of enhancement of the polishing removal rate of the silicon nitride in each of Examples 1 to 8 and Comparative Examples 2 to 14 (Polishing removal rate of silicon nitride in each of Examples 1 to 8 and Comparative Examples 2 to 14]/[Polishing removal rate of silicon nitride in Comparative Example 1]) was calculated and shown in Table 1.

Similarly, based on the polishing removal rate of the silicon nitride in Comparative Example 15, the polishing removal rate improvement rate indicating the degree of enhancement of the polishing removal rate of the silicon nitride in each of Examples 9, 10 was calculated and also shown in Table 1.

Further, similarly, based on the polishing removal rate of the silicon nitride in Comparative Example 16, the polishing removal rate improvement rate indicating the degree of enhancement of the polishing removal rate of the silicon nitride in Comparative Example 17 was calculated and also shown in Table 1.

As is understood from the results shown in Table 1, the polishing compositions of Examples 1 to 10 contain the abrasives (silica) having a positive zeta potential and the cyclic compound having a mother nucleus with a ring structure and two or more anionic functional groups bonded to the mother nucleus, and therefore the polishing removal rate of the silicon nitride was high, and thus the silicon oxide and the silicon nitride were able to be polished at substantially the same polishing removal rate.

In contrast thereto, the polishing composition of Comparative Example 1 does not contain the cyclic compound, and therefore the polishing removal rate of the silicon nitride was significantly lower than the polishing removal rate of the silicon oxide. In the polishing compositions of Comparative Examples 6, 7, although the mother nucleus of the additives has a ring structure, the number of the anionic functional groups bonded to the mother nucleus is 1, and therefore the polishing removal rate of the silicon nitride was significantly lower than the polishing removal rate of the silicon oxide. In the polishing compositions of Comparative Examples 2 to 5 and Comparative Examples 8 to 14, the mother nucleus of the additives does not have a ring structure, and therefore the polishing removal rate of the silicon nitride was significantly lower than the polishing removal rate of the silicon oxide. The polishing compositions of Comparative Examples 16, 17 contain the abrasives having a negative zeta potential, and therefore the polishing removal rate of the silicon nitride was higher than that of the silicon oxide.

<Evaluation of Number of Defects>

(Polishing Apparatus and Polishing Conditions)

Objects to be polished were individually polished using the polishing compositions of Examples 2, 5, 11 and Comparative Examples 18, 19. The objects to be polished are silicon wafers (blanket wafers) with a silicon nitride film. The diameter of each wafer is 300 mm, and the polishing conditions are as follows.

Polishing apparatus: One side CMP polishing apparatus for 300 mm wafer, FREX300E manufactured by EBARA CORPORATION
Pad: Polyurethane pad
Polishing pressure: 2.0 psi (about 13.8 kPa)
Rotational speed of polishing platen: 30 min$^{-1}$
Rotational speed of carrier: 31 min$^{-1}$
Supply method of polishing composition: In one-way
Supply flow rate of polishing composition: 200 mL/min
Polishing time: 60 sec (Cleaning Apparatus and Cleaning Conditions)

The objects to be polished that were polished as described above were removed from the polishing platen of the polishing apparatus described above, and cleaned using the following cleaning liquid in the same polishing apparatus. In detail, the polished objects to be polished, which are objects to be cleaned, were cleaned by rubbing the polished objects to be polished with a polyvinyl alcohol (PVA) sponge, which is a cleaning brush, while applying pressure and supplying the cleaning liquid. The cleaning conditions are as follows.

Polishing apparatus: One side CMP polishing apparatus for 300 mm wafer, FREX300E manufactured by EBARA CORPORATION Cleaning liquid: Ammonia water having a concentration of 0.3% by mass Rotational speed of cleaning brush: 150 $\text{min}^{-1}$ Rotational speed of object to be cleaned: 100 $\text{min}^{-1}$ Cleaning time: 20 sec The number of defects of the objects to be polished cleaned as described above was evaluated by the following method. More specifically, defects with a diameter of 0.10 μm or more present on the entire surface (excluding an outer periphery of 5 mm) of each wafer were detected using a defect detection device (wafer defect tester) "Surfscan SP2" manufactured by KLA-TENCOR Corporation. Then, all of the detected defects were observed using a Review SEM "RS-6000" manufactured by Hitachi High-Technologies Corporation, thereby totalizing the number of defects. The results are shown in Table 1.

As is understood from the results shown in Table 1, the polishing compositions of Examples 2, 5, 11 contain the abrasives (silica) having a positive zeta potential, and therefore the silicon nitride was able to be polished with a small number of defects.

The invention claimed is:

1. A polishing composition comprising:
   abrasives having a positive zeta potential; and
   a cyclic compound having a mother nucleus with a ring structure and three or more anionic functional groups bonded to the mother nucleus, wherein
   the abrasives contain silica.

2. The polishing composition according to claim 1, wherein at least one of the anionic functional groups is at least one of a carboxy group and a sulfo group.

3. The polishing composition according to claim 1, wherein a pH is less than 7.

4. The polishing composition according to claim 1, wherein the abrasives contain colloidal silica.

5. The polishing composition according to claim 2, wherein a pH is less than 7.

6. The polishing composition according to claim 2, wherein the abrasives contain colloidal silica.

7. The polishing composition according to claim 3, wherein the abrasives contain colloidal silica.

8. A polishing method comprising:
   polishing an object to be polished containing silicon nitride using the polishing composition according to claim 1.

9. A polishing method comprising:
   polishing an object to be polished containing silicon oxide and silicon nitride using the polishing composition according to claim 1.

10. A polishing method comprising:
    polishing an object to be polished containing silicon nitride using the polishing composition according to claim 2.

11. A polishing method comprising:
    polishing an object to be polished containing silicon oxide and silicon nitride using the polishing composition according to claim 2.

12. A polishing method comprising:
    polishing an object to be polished containing silicon nitride using the polishing composition according to claim 3.

13. A polishing method comprising:
    polishing an object to be polished containing silicon oxide and silicon nitride using the polishing composition according to claim 3.

14. A polishing method comprising:
    polishing an object to be polished containing silicon nitride using the polishing composition according to claim 4.

* * * * *